(12) United States Patent
Yang et al.

(10) Patent No.: US 7,277,293 B2
(45) Date of Patent: Oct. 2, 2007

(54) HEAT SINK CONDUCTION APPARATUS

(75) Inventors: Chih-Kai Yang, Taipei (TW); Frank Wang, Taipei (TW); Yi-Lun Cheng, Taipei (TW)

(73) Assignee: Inventec Corporation (TW)

( * ) Notice: Subject to any disclaimer, the term of this patent is extended or adjusted under 35 U.S.C. 154(b) by 290 days.

(21) Appl. No.: 11/103,308

(22) Filed: Apr. 11, 2005

(65) Prior Publication Data

US 2006/0227509 A1     Oct. 12, 2006

(51) Int. Cl.
*H05K 7/20* (2006.01)
(52) U.S. Cl. .............. 361/719; 165/80.3; 165/185; 257/719; 361/704; 361/710
(58) Field of Classification Search ........ 257/718–719; 361/704, 719–720
See application file for complete search history.

(56) References Cited

U.S. PATENT DOCUMENTS

| | | | | |
|---|---|---|---|---|
| 5,662,163 A | * | 9/1997 | Mira | 165/80.3 |
| 6,008,990 A | * | 12/1999 | Liu | 361/704 |
| 6,097,601 A | * | 8/2000 | Lee | 361/704 |
| 6,141,220 A | * | 10/2000 | Lin | 361/704 |
| 6,151,214 A | * | 11/2000 | Yeh | 361/695 |
| 6,307,747 B1 | * | 10/2001 | Farnsworth et al. | 361/704 |
| 6,646,881 B1 | * | 11/2003 | Lai et al. | 361/719 |
| 6,858,792 B2 | * | 2/2005 | Franz et al. | 174/16.1 |
| 6,885,557 B2 | * | 4/2005 | Unrein | 361/704 |
| 6,950,310 B2 | * | 9/2005 | Edwards | 361/721 |
| 2004/0052054 A1 | * | 3/2004 | Huang et al. | 361/719 |

* cited by examiner

*Primary Examiner*—Gregory D Thompson
(74) *Attorney, Agent, or Firm*—Venable LLP; Raymond J. Ho

(57) ABSTRACT

A heat sink conduction apparatus is disclosed. The heat sink conduction apparatus is utilized in the heat sink assembly of an electronic device to thermal conduct with a heat source component. The apparatus comprises a thermal pad and a clip. The side of the thermal pad, where is connected with the heat source component, has at least one buckle pillar and one screw pillar. The clip includes a pair of spring plates and a pair of beams; each of the spring plate corresponding to each of the buckle pillars has a buckle and corresponding to each of the screw pillars has a screwed hole. The thermal pad supported a clip by the buckle pillar and the screw pillar, via the connection of the clip with the buckle pillar and the screw pillar, the heat source component can be fixed and make the surface of the heat source component to connect with the thermal pad in heat conductive manner.

8 Claims, 4 Drawing Sheets

HEAT SINK CONDUCTION APPARATUS

BACKGROUND OF THE INVENTION

1. Field of the Invention

The present invention relates to a heat sink conduction apparatus, and more particularly, to a heat sink conduction apparatus utilized in heat sink assembly of the notebook computer to thermal conduct with a heat source component.

2. Description of the Related Art

In general notebook computer circuit, Central Processing Unit (CPU), South Bridge chipset, North Bridge chipset, display chip, and etc. are used as the major operation and control units. The high temperature will be generated as those chips are often operated in high speed or be operated with large quantity. In order to make the related chips can work under a normal temperature, regarding heat-dissipate issues become an important topic need to overcome in a notebook computer. Besides, more and more notebook computers are stress on their light, thin, short, and small characters, the space inside of the notebook computers is designed as small as possible. Therefore, the design and arrangement of circuits and heat sink modules become very important on how to utilize the limited inside space of the notebook computer.

Usually, the CPU, south bridge chipset, north bridge chipset or display chip are arranged on a mother board in a conventional notebook computer. Therefore, those chips are installed in the same plane. Because of this, the design of related heat sink assembly will be designed on the same plane as well. Thus, those circuits and apparatus install on the horizontal plane, which leads to a crowded situation on horizontal plane and leaves a vacant space on vertical plane of a notebook computer.

Modern customers demand more and more on efficiency and capacity of upgrading to the display card. Hence, the design of display card is tend to be detachable which like an interface card of a desktop, not to fix to the mother board any more. Therefore, the display card can be installed on the different plane to the CPU, South Bridge chipset or North Bridge chipset. As the notebook computer is toward small and thin in design, to minimize the installed space of the display card, the design of the display card in insert way is different from that of the desktop. In notebook computer, the display card is horizontally inserted into a slot on the mother board instead of vertical insertion as the insert way of a desktop. Therefore, how to dissipate the heat generated from display chip becomes a topic and a need to be overcome.

In a conventional notebook computer, the heat sink assembly is installed on the CPU or the display chip of the mother board. Via the thermal pad of heat sink assembly, the heat sink assembly can closely attach with the surface of CPU or display chip to achieve the heat transfer and heat dissipate effect. However, in current notebook computer, regarding the design of the display card tends to be designed to a detachable card. Therefore, the conventional heat sink assembly can't be adopted by the detachable display card in notebook computer.

SUMMARY OF THE INVENTION

The primary objective of the present invention is to provide a heat sink conduction apparatus, which is utilized in the heat sink assembly of an electronic device, to thermal conduct with a heat source component. The heat sink conduction apparatus can make an interface card and a thermal plate to stably hold as a unit in a thermal conductive manner. Therefore, it is not easy to damage when one carries or moves the notebook computer, and can efficiently dissipate the heat generated from a display chip or a graphic chip of an interface card when it is operated.

To reach above, the present invention provides a heat sink conduction apparatus comprising a thermal pad and a clip.

The thermal pad is a well thermal conductive metal plate, connected with heat source component of an electronic device. The side of the thermal pad, where is connected with heat source component, has at least one buckle pillar and at least one screw pillar.

The clip includes a pair of spring plates and a pair of beams. The spring plate has a buckle and a screwed hole. Each buckle corresponds to each of the buckle pillar and each the screwed hole corresponds to each of the screw pillar.

When a heat sink conduction apparatus is in use, the thermal pad supports a clip by at least a buckle pillar and at least a screw pillar. Via the connection of the clip with the buckle pillar and the screw pillar, the heat source component can be fixed and make the surface of the heat source component to connect with the thermal pad in heat conductive manner.

Thus, the implementation of this present invention brings forth at least the following desirable results:

1. The heat generated on an interface card can be dissipated efficiently when it is operating.

2. The heat sink assembly can stably combine with the interface card as a unit.

3. The assembly process will be more simple and efficiency when the heat sink assembly connects with the interface card.

BRIEF DESCRIPTION OF THE DRAWINGS

The invention will become more fully understood from the detailed description given below for illustration only, and thus are not limitative of the present invention, and wherein.

DETAILED DESCRIPTION OF THE INVENTION

Figure 1:
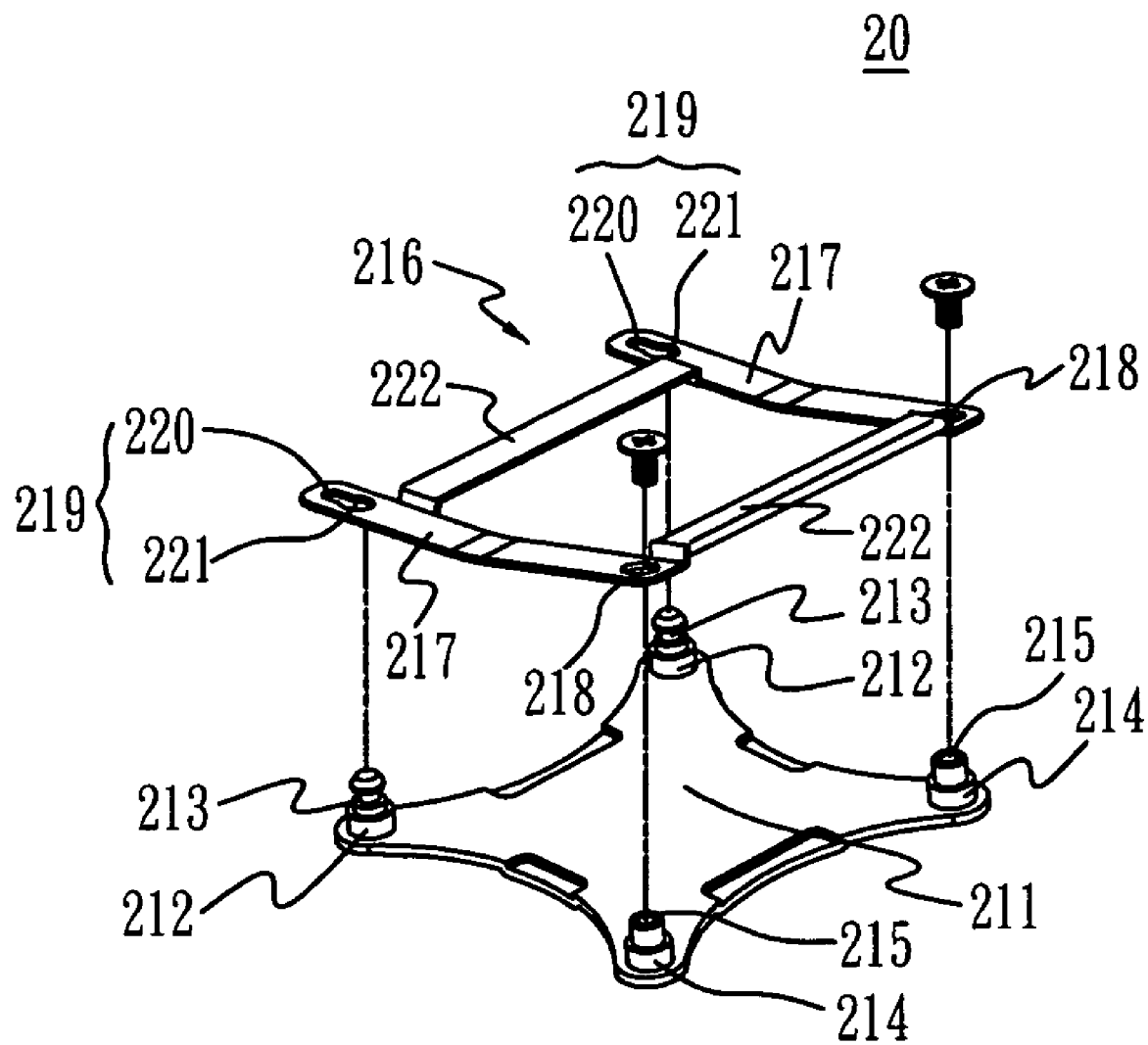
FIG. 1 shows an exploded perspective view of one embodiment of the present invention of a heat sink conduction apparatus.
Figure 2:
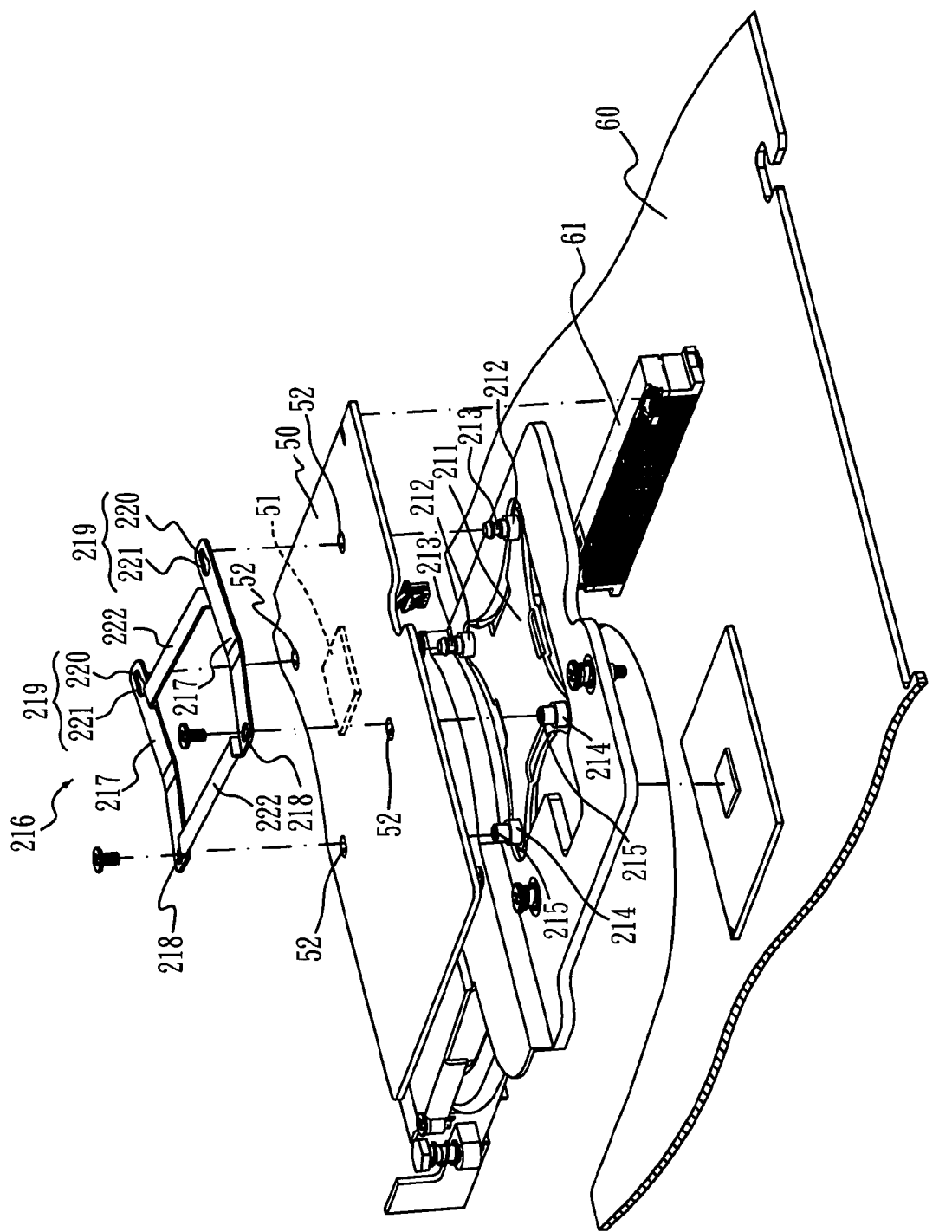
FIG. 2 shows an exploded perspective view of one embodiment of the present invention of heat sink conduction apparatus with an interface card.

Referring to FIGS. 1 and 2, an exploded perspective view of one embodiment of the present invention of heat sink conduction apparatus and an exploded perspective view of one embodiment of the present invention of a heat sink conduction apparatus with an interface card are shown. The heat sink conduction apparatus is utilized in the heat sink assembly of an electronic device, to thermal conduct with a heat source component (i.e. display chip or graphic chip), comprising a thermal pad 211 and a clip 216.

The thermal pad 211 is a well thermal conductive metal plate, utilized to connect with a heat source component 51 of an electronic device for a thermal conductive purpose. Via the surface connection between the thermal plate and a heat source component (display chip or graphic chip), the thermal pad can effectively dissipate the heat out of the heat source component. Also, to achieve the heat conductive well, the thermal pad 211 is usually made of a copper or an aluminum to have better thermal conductive effect.

To closely connect with the heat source component 51, at least one buckle pillar 212 and at least one crew pillar 214 are set on the side of the thermal pad 211, where connects with the heat source component 51. To stably connect with thermal pad 211, those pillars are riveted to the thermal pad 211. The buckle pillar 212 has a horizontal ring curve 213 near the top thereof. The screw pillar 214 has a screw hole 215 on the top thereof.

The clip 216 is constructed of a pair of spring plates 217 and a pair of beams 222; the beams 222 are applied to hold still those spring plates 217; each one of those spring plates 217 is a curve metal plate which is lower in the center and higher in the end. The spring plate 217 corresponding to the each buckle pillar 212 has a buckle 219, and corresponding to each screw pillar 214 has a screwed hole 218. Enable to simply connect with the clip 216 and the buckle pillar 212, the buckle 219 of the buckle pillar 212 is designed to have a buckle portion 220 and an extend portion 221.

Figure 3:
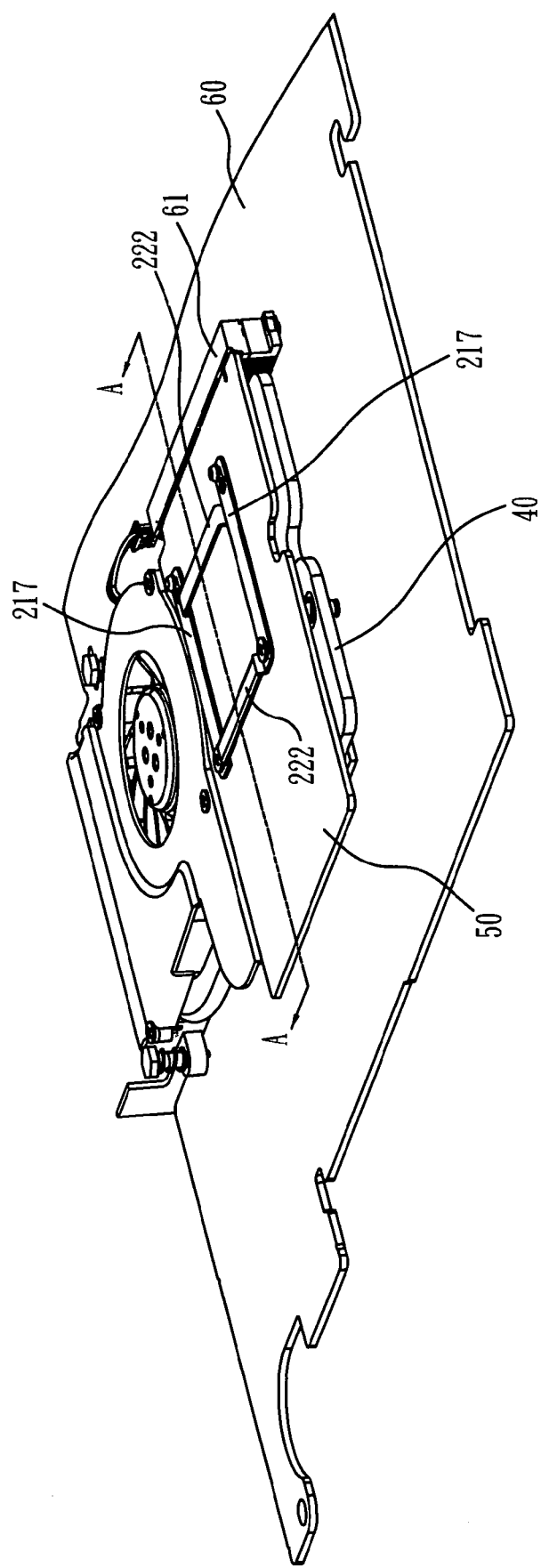
FIG. 3 shows a perspective view of one embodiment of the present invention of heat sink conduction apparatus connected with a interface card.

Referring to FIGS. 2 and 3, an exploded perspective view of one embodiment of the present invention of a heat sink conduction apparatus with an interface card and a perspective view of one embodiment of the present invention of heat sink conduction apparatus connected with a interface card are shown. The heat sink conduction apparatus 20 (referring to FIG. 1) is stably hold by a supporting plate 40. The interface card 50 is a display card (i.e. VGA card) or a graphic card (i.e. MXM card) and also a display chip or a graphic chip of the interface card 50 is installed on the lower part of the interface card 50. The interface card 50 can connect with the mother board 60 via a slot 61. Then, the buckle pillar 212 and the screw pillar 214 of the thermal pad 211 pass through the holes 52 which are set on the interface card 50. After that, the buckle 219 of the clip 216 can connect with the ring curve 213 of the buckle pillar 212 and the screwed hole 218 of the clip 216, aimed at the screw hole 215 of the screw pillar 214, can connect with the screw pillar 214 by the screw to tighten them.

When the clip 216 is to be connected with the ring curve 213 of the buckle pillar 212, due to the buckle 219 having a buckle potion 220 and an extend potion 221, the buckle 219 can be more easy to aim at the buckle pillar 212 via the space provided by the extend portion 221. The spring plate 217 of the clip 216 is a curve plate. Hence, when one side of the clip 216 is jointed with the buckle pillar 212 and the other side of the clip 216 is fixed on the screw pillar 214 by screw, there will have a tension on the clip 216 due to pressure. By this tension, the interface card 50 can be held.

Figure 4:
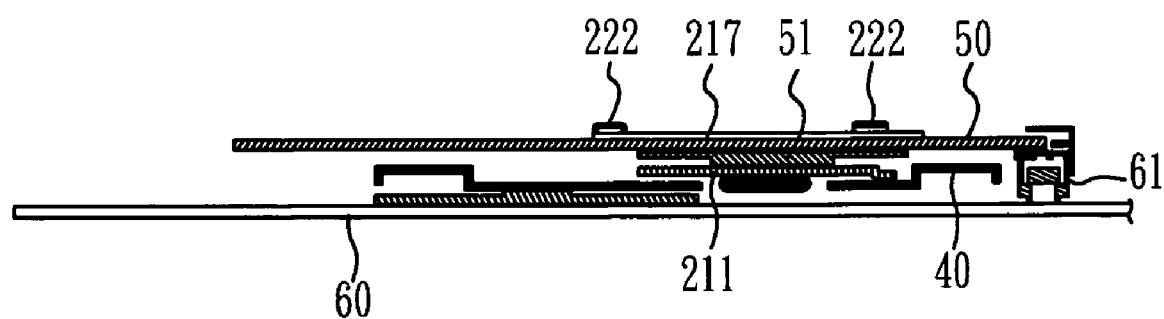
FIG. 4 shows a sectional line A-A of one embodiment of the present invention of the heat sink conduction apparatus connected with display card.

Referring to FIG. 4, a sectional view taken along line A-A of FIG. 3 is shown. The heat sink conduction apparatus can make the surface of the heat source component 51 (display chip or graphic chip) installed on the interface card 50 to closely attach to the thermal pad 211.

Those described above are only the preferred embodiments of the present invention, and it is no intended to limit the scope of the present invention. And equivalent variation and modification according to the appended claims of the present invention would not depart from the spirit of the present invention and is to be included within the scope of the present invention.

What is claimed is:

1. A heat sink conduction apparatus, for thermal conducting with a heat source component of an electronic device, comprising:
   a thermal pad, having at least one buckle pillar and at least one screw pillar on the side of said thermal pad connecting with said heat source component; and
   a clip, comprising:
   a pair of spring plates;
   a pair of beams, for holding said spring plates;
   at least one buckle, on said pair of spring plates, corresponding to said at least one buckle pillar respectively;
   at least one screwed hole, on said pair of spring plates, corresponding to said at least one screw pillar respectively,
   wherein said thermal pad is supporting said clip by said buckle pillar and said screw pillar; and said clip is connected to said buckle pillar and said screw pillar, such that said heat source component can be fixed and allows the surface of said heat source component to connect with said thermal pad in heat conductive manner.

2. The heat sink conduction apparatus as claimed in claim 1, wherein said thermal pad is a plate.

3. The heat sink conduction apparatus as claimed in claim 1, wherein said thermal pad is made of copper or aluminum.

4. The heat sink conduction apparatus as claimed in claim 1, wherein said buckle pillar and said screw pillar are riveted to said thermal pad.

5. The heat sink conduction apparatus as claimed in claim 1, wherein at least one of said spring plates is a curve spring plate.

6. The heat sink conduction apparatus as claimed in claim 1, wherein said buckle includes a buckle portion and an extend portion.

7. The heat sink conduction apparatus as claimed in claim 1, wherein at least one of said spring plates is a metal spring plate.

8. The heat sink conduction apparatus as claimed in claim 1, wherein the electronic device has an interface card, and the heat source component is installed on the interface card.

* * * * *